United States Patent [19]

Phillips

[11] Patent Number: 4,966,428

[45] Date of Patent: Oct. 30, 1990

[54] MANUFACTURE OF INTEGRATED CIRCUITS USING HOLOGRAPHIC TECHNIQUES

[75] Inventor: Nicholas J. Phillips, Loughborough, England

[73] Assignee: Holtronic Technologies Limited, London, Great Britain

[21] Appl. No.: 306,638

[22] Filed: Feb. 3, 1989

[30] Foreign Application Priority Data

Feb. 3, 1988 [GB] United Kingdom ............... 8802333

[51] Int. Cl.$^5$ ............................................. G03H 1/20
[52] U.S. Cl. .................................. 350/3.66; 350/3.6; 350/3.69
[58] Field of Search ...................... 358/3.6, 3.66, 3.67, 358/3.69, 3.74, 3.75, 3.78, 3.84

[56] References Cited

U.S. PATENT DOCUMENTS

| | | | |
|---|---|---|---|
| 3,715,482 | 2/1973 | Haines et al. | 350/3.66 |
| 4,416,540 | 11/1983 | Nicholson | 350/3.69 |
| 4,715,670 | 12/1987 | Turukhano | 350/3.69 |
| 4,857,425 | 8/1989 | Phillips | 350/3.69 |

OTHER PUBLICATIONS

"Submicrometer Holographic Photolithography" by John Brook and René Dändliker—Solid State Technology—Nov. '89.

Primary Examiner—Rodney B. Bovernick
Assistant Examiner—J. P Ryan
Attorney, Agent, or Firm—Stanger, Michaelson, Spivak & Wallace

[57] ABSTRACT

Apparatus for the manufacture of integrated circuits using holographic techniques in which a holographic image formed on a first recording medium provided on a glass slab is replayed by being scanned in order to reproduce an image of the holographic image on a second recording medium provided on a silicon slice. The replay source provides a a collimated narrow circular beam or elongated beam which passes normally through a face of the prism, through an index matching liquid located between the prism and the glass slab before being totally internally reflected at the other surface of the glass slab. The collimated replay beam provides control over the effective numerical aperture thus preventing wide angle radiation from degrading the quality of the printed image.

10 Claims, 3 Drawing Sheets

MANUFACTURE OF INTEGRATED CIRCUITS USING HOLOGRAPHIC TECHNIQUES

FIELD OF THE INVENTION

The present invention relates to the manufacture of integrated circuits using holographic techniques, and to an improvement of the method disclosed in U.S. Pat. No. 4,857,425.

DESCRIPTION OF THE PRIOR ART

In the method disclosed in the above numbered Patent Specification, an integrated circuit is manufactured by means of the following basic steps:

(a) providing a first recording medium which exhibits negligible scatter and high resolution without shrinking or distorting;

(b) forming a volumetric holographic image of the integrated circuit on the first recording medium by interference between an input beam of coherent light passing through a mask containing the pattern of the integrated circuit, and a reference beam of coherent light which is totally internally reflected at the surface on which the first recording medium is located;

(c) replacing the mask by a silicon slice having a second recording medium in order to reproduce the holographic image of the integrated circuit;

(d) replaying the recorded volumetric holographic image by means of a second reference beam which travels in the reverse direction, the resulting interference between the hologram and the second reference beam causing an image of the integrated circuit contained in the mask to be formed on the second recording medium provided on the silicon slice; and (e) repeating the replaying operation a plurality of times with a plurality of silicon slices.

Various problems arise from the above described method of manufacturing integrated circuits using holographic techniques. One of these problems relates to the beam diameter of the second reference beam used in the replay operation to obtain an image of an integrated circuit on a silicon slice. It will be appreciated that as printed circuit technology advances the design becomes ever more complicated and the density of integration higher. It therefore becomes more difficult to obtain an absolutely accurate holographic reproduction of the integrated circuit onto the silicon slice because of beam non-uniformity.

Furthermore, it will also be appreciated that interference of light which is invoked in holographic replay is polarization dependent and that it can hardly be expected that extreme wide angle rays will interfere adequately with paraxial rays.

SUMMARY OF THE INVENTION

It is an object of the invention to overcome partially or wholly the above mentioned disadvantage by obtaining a limited controlled beam size.

According to the present invention there is provided apparatus for the manufacture of integrated circuits using holographic techniques in which a holographic image of an object containing the pattern of integrated circuit to be reproduced is formed on a first recording medium by interference between an input beam which passes through the object and a reference beam which is totally reflected on the topside surface of the recording medium on a glass slab, interference occurring both with the incident and reflected reference beam; and in which an image of an integrated circuit is formed on a second recording medium provided on a silicon slice by replay of the holographic image formed on the recording medium utilizing the same interference technique; said apparatus additionally including:

(a) means for providing a restricted replay beam; and (b) means for sequentially moving the replay beam smoothly or in discrete steps in order to build-up an image of an integrated circuit on the second recording medium provided on the silicon slice.

The use of a restricted replay beam provides control over the effective numerical aperture of the replay system, with the specific aim of preventing wide angle radiation upsetting the quality of the printed image.

BRIEF DESCRIPTION OF THE DRAWINGS

The present invention will now be described in greater detail by way of example with reference to the accompanying drawings wherein.

DESCRIPTION OF THE PREFERRED EMBODIMENT

Figure 1:
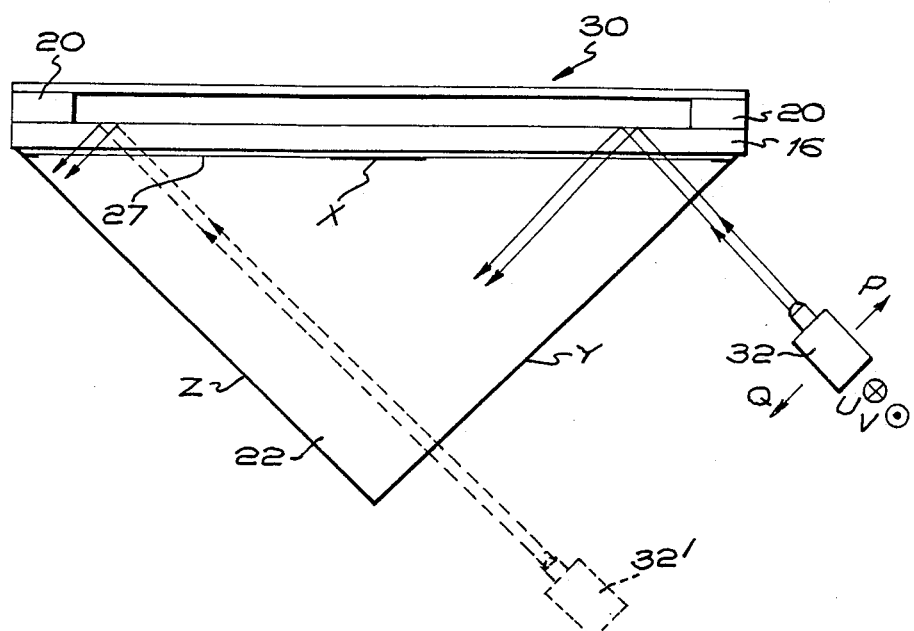
FIG. 1 is a diagrammatic arrangement of apparatus illustrating the replay in order to record the holographic image onto a recording medium provided on the silicon slice, utilizing a scanning technique.

Referring now to FIG. 1 in the replay operation to form an image of the integrated circuit on a recording medium provided on a silicon slice 30, the second reference beam is provided by a laser source or mercury lamp 32 referred to in U.S. Pat. No. 4,857,425. In order for the light to pass through a prism 22 into a glass slab 16 and hence the first recording medium, it is necessary that an index matching liquid 27 be provided between the glass slab 16 and the surface X of the prism 22, the construction of the prism is such that light is totally internally reflected at the recording medium/air interface. A mask in the form of a diaphragm having a circular aperture is provided in the lensing arrangement of the source so as to generate a replay beam of controlled size in the form of a rod with a circular cross-section so as to provide a uniform scan. The source 32 is moved in a continuous manner so as to scan the holographic image on the first recording medium. This may be done in a similar manner to a television scan, i.e. in the direction of the arrows P and Q and symbols U and V so as to progressively build-up the image of the integrated circuit on the second recording medium provided on the silicon slice from the holographic image recorded on the first recording medium of the glass plate by interference between the incident and reflected beams from the reference replay source 32. The final result thus provides a uniform scan.

The uniformity of the holographic image is obtained on the entire surface of the coated silicon. Furthermore the intensity of the replayed beam which arrives at the hologram is maximized.

Movement of the reference replay source can be achieved by mounting it on a trolley movable along a pair of rails in the direction of the arrows P and Q by means of an electric motor. The rails are mounted on a rack for movement in the direction of the arrows U and V, the rack being driven in steps by an electric motor.

Figure 2A:
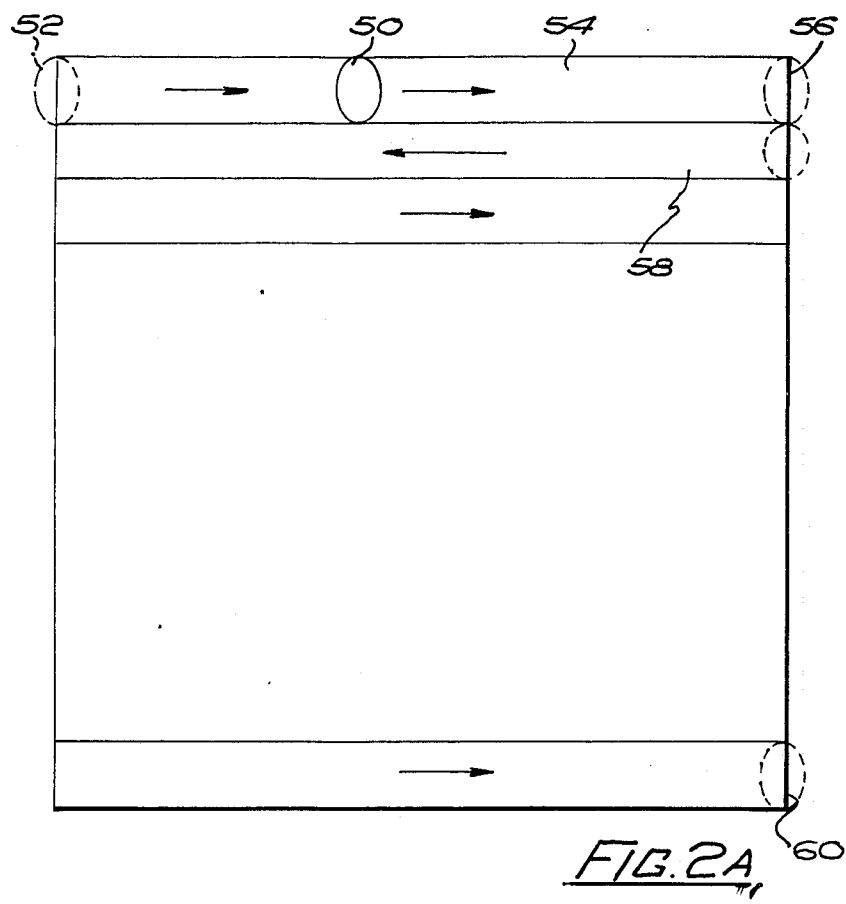
FIGS. 2A, 2B and 2C show alternate methods of scanning which may be used.

Referring now to FIG. 2A, the apparatus shown in FIG. 1 produces a replay beam, which at any instant in the scan illuminates an elliptical area 50. The scanning process may start at one corner 52 of the area of the holographic image recorded on the recording medium and proceed in a line 54 to a second corner 56. The laser source of the replay reference beam is then moved a discrete amount at right angles and the scan then takes place in the reverse direction along a line 58. In this way the holographic image is scanned in a zig-zag manner from one corner 52 to the diametrically opposite corner 60. Alternatively scanning may be performed in the manner that a television screen is scanned. The only problem with this method is the flyback which due to the inertia of the source takes a finite time to return to the beginning of each line.

Figure 2B:
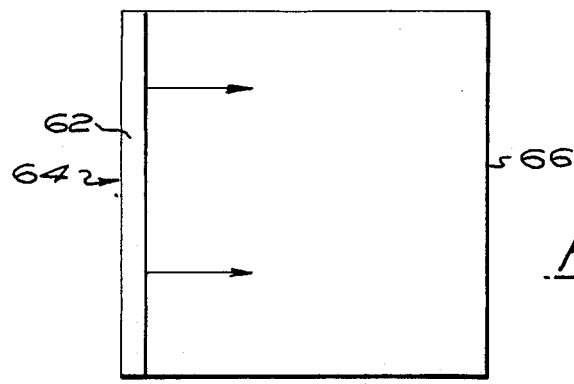
Figure 2C:
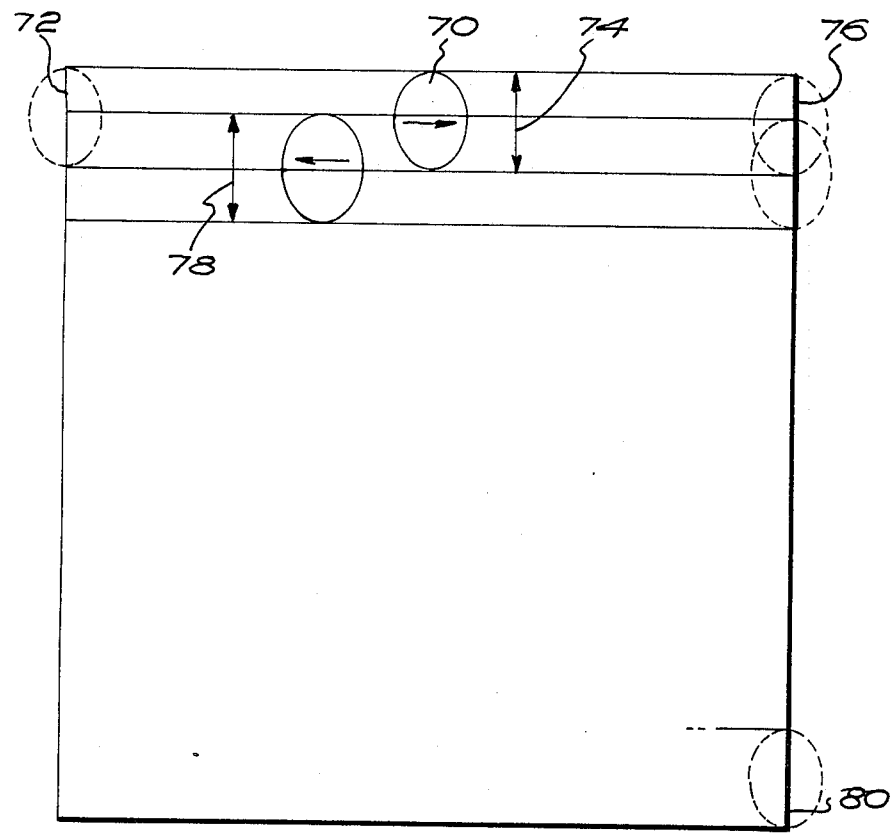

A further alternative method of scanning is shown in FIG. 2C. The sequence of scanning is identical with that shown in FIG. 2A except that there is an overlap in the area scanned in each scan. In this case the process starts at one corner 72 and proceeds in a horizontal line 74 to a second corner 76. The laser source is then moved by an amount which is less than half the width of the scanned line 74 to scan in a reverse direction along a horizontal line 78. The holographic image is thus scanned in a zig-zag manner from the corner 70 to the diametrically opposite corner 80, each line overlapping with a preceding line.

Referring now to FIG. 2B, it may be possible to provide a replay beam in the form of an elongated bar 62, which extends across one side 64 of the area occupied by the holographic image. This has the advantage that only one scan to the opposite side 66 is necessary. However, it is only practical if uniformity of the replay reference beam can be achieved along the entire length of the bar 62, and if the silicon wafer is flat over this area.

Although the apparatus described above is relevant only to the replay operation in order to reproduce an image of the hologram onto the second recording medium provided on the silicon slice in order to build-up the image of the integrated circuit, the scanning technique may with appropriate adaption be used to form the holographic image on the first recording medium. However, there is an added problem here in that the input laser and the reference laser must be accurately synchronized throughout the entire scanning operation, otherwise it may be difficult to obtain an accurate reproduction of the integrated circuit as a holographic image. The scanning technique may be the same as discussed above, the single scan of an elongated bar of the input and reference beams having distinct advantages from the viewpoint of synchronism and accurate reproduction.

The above described apparatus in which an image of the integrated circuit is formed on the second recording medium provided on the silicon slice in the replay operation by the above described scanning techniques has the following advantages:

(a) beam non-uniformity is overcome by overlap of the beam during scanning;

(b) the intensity of the replayed beam which arrives at the hologram is maximized.

(c) the aberration is substantially reduced; and (d) the numerical aperture of the reference replay laser sources is controllable;

the latter two advantages occurring as a result of the reduced size of the ray bundle arriving and being reflected from the topside surface of the first recording medium.

What I claim is:

1. Apparatus for the manufacture of integrated circuits using holographic techniques including:
    (a) a glass slab;
    (b) a first recording medium provided on a first surface of the glass slab on which a hologram of an integrated circuit has been recorded;
    (c) a prism one face of which is juxtapositioned at a second surface of the glass slab;
    (d) an index matching liquid located between the glass slab and the prism;
    (e) means for generating a narrow replay beam of collimated light which passes through the prism and which is totally internally reflected at the first surface of the glass slab;
    (f) a second recording medium provided on a silicon wafer, the replay operation effecting the printing of an image of an integrated circuit on the second recording medium by regeneration from the hologram; and
    (g) means for moving the narrow replay beam generating means so that the collimated light smoothly in a zig-zag manner in lines of alternate direction from one corner of the surface of the glass slab to a diametrically opposite corner, whereby the whole hologram is scanned and the image of the integrated circuit recorded on the second recording medium of the silicon wafer.

2. Apparatus according to claim 1, wherein said means for moving the narrow replay beam generating means comprises: trolley means mounted on a pair of guide rails; means for moving said trolley smoothly from one end of the rails to the other; rack means on which the guide rails are mounted; and means for moving the rack means in an orthogonal direction in steps when said trolley arrives at the end of a line of travel in order to obtain said zig-zag movement of the narrow replay beam across the surface of the glass slab.

3. Apparatus according to claim 2, wherein degree of movement of the means for moving the rack means is such that the lines of zig-zag scanning overlap one another.

4. Apparatus according to claim 1, wherein said means for providing a narrow replay beam of collimated light comprises a laser provided with a lensing arrangement, and a mask having a circular aperture located in the lensing arrangement of the laser in order to generate the narrow beam of collimated light with a circular cross-section.

5. Apparatus according to claim 1, wherein said means for providing a narrow replay beam of collimated light comprises a mercury lamp provided with a lensing arrangement, and a circular apertured mask located in the lensing arrangement of the lamp to generate the narrow beam of collimated light with a circular cross-section.

6. Apparatus for the manufacture of integrated circuits using holographic techniques including:
    (a) a glass slab;
    (b) a first recording medium provided on a first surface of the glass slab on which a hologram of an integrated circuit has been recorded;
    (c) a prism whose largest face is located adjacent a second surface of the glass slab;
    (d) an index matching liquid sandwiched between the glass slab and the largest face of the prism;
    (e) a laser source providing a narrow collimated beam of coherent light which passes through the prism and which is totally internally reflected at the first surface of the glass slab;

(f) a second recording medium provided on the surface of a silicon slice, the replay operation using the laser effecting the printing of an image of an integrated circuit on the second recording medium by regeneration from the hologram; and (g) means for moving the laser source so as to move the collimated beam of coherent light in discrete steps over the entire surface of the glass slab, whereby the whole hologram is scanned and the image of the integrated circuit recorded on the second recording medium of the silicon wafer.

7. Apparatus according to claim 6, wherein said means for moving said laser source in discrete steps is controlled to move said laser in lines across the glass slab in zig-zag manner from one corner to the other corner of the glass slab.

8. Apparatus according to claim 6, where said laser source moving means comprises: trolley means mounted on a pair of parallel guide rails; means for moving said trolley in discrete steps from one end of the rails to the other; rack means on which the guide rails are mounted; and means for moving the rack means in an orthogonal direction in steps when said trolley arrives at the end of a line of travel in order to obtain said zig-zag movement of the replay beam from the laser source across the surface of the glass slab.

9. Apparatus according to claim 6, wherein said laser source is provided with masking means having a circular aperture in the lensing arrangement of the laser source.

10. Apparatus according to claim 6, wherein said laser source is provided with masking means having an elongated bar in the lensing arrangement of the laser source such that a collimated beam illuminates a longitudinal strip of the glass slab extending along one edge thereof, whereby a single line of discrete step movements enables the hologram to be scanned and the image of the integrated circuit recorded on the second recording medium of the silicon wafer.

* * * * *